United States Patent [19]

Fitzpatrick et al.

[11] Patent Number: 4,897,836
[45] Date of Patent: Jan. 30, 1990

[54] PROGRAMMABLE CONNECTION PATH CIRCUIT

[75] Inventors: Mark E. Fitzpatrick; Yat-Sum Chan; Richard F. Pang, all of San Jose; Gary R. Gouldsberry, Cupertino, all of Calif.

[73] Assignee: Gazelle Microcircuits, Inc., Santa Clara, Calif.

[21] Appl. No.: 111,389

[22] Filed: Oct. 20, 1987

[51] Int. Cl.⁴ .................................................. H04J 3/02
[52] U.S. Cl. ..................................... 370/112; 307/243
[58] Field of Search ............... 370/13, 16, 112; 371/3, 371/17, 15; 307/243, 244; 328/104, 105

[56] References Cited

U.S. PATENT DOCUMENTS

| 4,092,589 | 5/1978 | Chau et al. | |
|---|---|---|---|
| 4,206,443 | 6/1980 | Britton | 361/66 |
| 4,347,602 | 8/1982 | Kister et al. | 370/16 |
| 4,387,503 | 6/1983 | Aswell et al. | 357/86 |
| 4,390,837 | 6/1983 | Hotvedt | |
| 4,409,683 | 10/1983 | Woodward | 370/112 |
| 4,419,588 | 12/1983 | Goiset | 361/66 |
| 4,556,975 | 12/1985 | Smith et al. | 371/10 |
| 4,561,120 | 12/1985 | Andow et al. | 361/68 |

FOREIGN PATENT DOCUMENTS

| 0066729 | 5/1982 | European Pat. Off. . |
| 0207249 | 4/1986 | European Pat. Off. . |
| WO 82/02096 | 6/1982 | PCT Int'l Appl. . |
| 2105050A | 8/1978 | United Kingdom . |
| 2149129A | 11/1983 | United Kingdom . |

Primary Examiner—Douglas W. Olms
Assistant Examiner—Min Jung
Attorney, Agent, or Firm—Skjerven, Morrill, MacPherson, Franklin & Friel

[57] ABSTRACT

A multiplexing type circuit includes circuit portions having input and output leads associated therewith, to allow testing of the individual circuit portions, and further includes laser programmable fuses which allow selective disconnection of certain input and output leads as chosen to disconnect circuit portions from the overall circuit as appropriate.

8 Claims, 1 Drawing Sheet

PROGRAMMABLE CONNECTION PATH CIRCUIT

BACKGROUND OF THE INVENTION

1. Field of the Invention

This invention relates to multiplexing type circuits, and more particularly, to such a circuit wherein selected input and output leads thereof can be disconnected.

2. Description of the Prior Art

In a typical prior art multiplexing circuit (FIG. 1 at 10), the circuit 10 can include a plurality of circuit portions 12, 14, 16, each having one or more input leads 18, 20, 22 and one or more output leads 24, 26, 28 connected thereto. The output leads 24, 26, 28 are in turn connected to an overall circuit output lead 30, and control leads 32, 34, 36 are individually connected to respective circuit portions 12, 14, 16 so that the user of the circuit 10 may choose which circuit portion he wishes to have in operation, and then apply input signals thereto and receive output signals therefrom to be applied to the overall output lead 30 of the circuit.

In this manner, the functions of each circuit portion can be applied individually as needed.

Presently, it has been found desirable to initially provide a multiplexing circuit which includes multiple circuit portions only one of which is to be chosen for ongoing future use, while the others may be initially included in but eventually excluded from the overall circuit. In such case, it may be desirable to test each of the circuit portions individually to determine its functionality (by application of high and low signals to appropriate circuit terminals in accordance with an established test program, as is well known), and then to choose the one which most optimally fits the needs of the user.

The multiplexing circuit of the type shown in FIG. 1 lends itself to that testing. However, such a circuit, subsequent to testing, includes the undesired circuit portions as part of the overall circuit, resulting in excessive use of power and a higher degree of loading on the previous and following circuits than is optimum.

SUMMARY OF THE INVENTION

It is accordingly an object of this invention to provide a multiplexing type circuit which allows for testing of individual circuits portions thereof, and subsequent disconnection of these circuit portions which are not desired as part of the overall circuit.

Broadly stated, the invention comprises a circuit having a first and second input leads and an output lead, comprising first circuit means connecting the first input lead of the circuit with the output lead of the circuit, second circuit means connecting the second input lead of the circuit with the output lead of the circuit, and laser programmable means for providing selective disconnection of the first input lead of the circuit from the output lead of the circuit, whereby testing of the first circuit means and second circuit means can be undertaken prior to providing the disconnection.

BRIEF DESCRIPTIONS OF THE DRAWINGS

Other objects of the invention will become apparent from a study of the following specification and drawings, in which:

FIG. 1 shows a typical prior art multiplexing circuit, and FIG. 2 shows the circuit incorporating the present invention.

DESCRIPTION OF THE PREFERRED EMBODIMENT

Figures 1, 2:
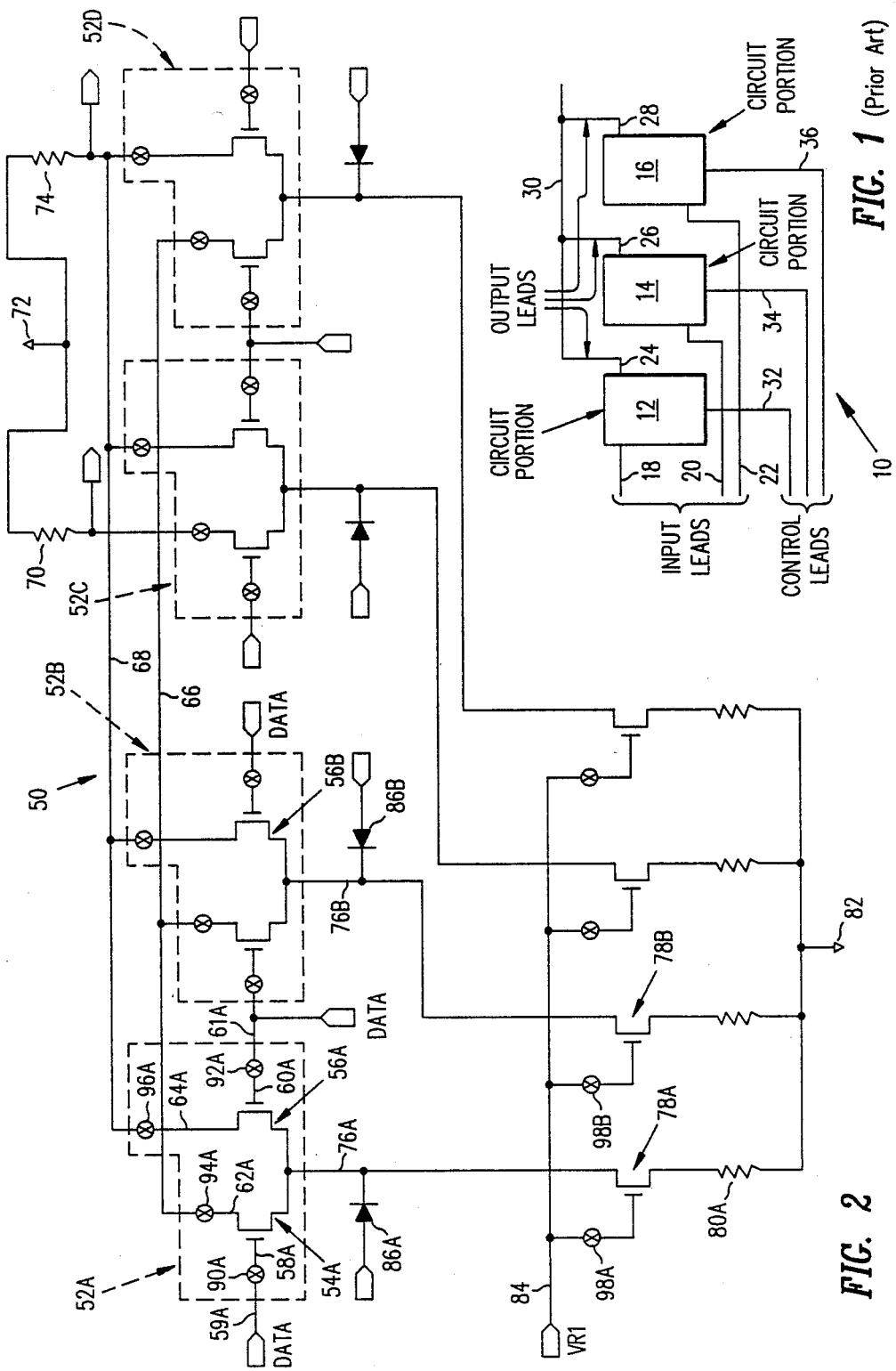

Shown in FIG. 2 is the overall multiplexing circuit 50 which incorporates the present invention. As shown therein, the multiplexing circuit includes circuit portions 52A, 52B, 52C, 52D, each of which includes paired switching transistors 54A, 56A, 54B, 56B, etc. Each circuit portion includes input leads 58A, 60A, etc. which are connected to the respective gates of the transistors 54A, 56A, etc. These input leads 58A, 60A, etc. are connected respectively to overall corresponding input leads 59A, 61A, etc. of the circuit 50. The drains of the transistors 54A, 56A etc. have respective output leads 62A, 64A etc. connected thereto. The output leads 62A, 62B etc. in turn connect to an output lead 66 of the overall circuit 50, while the output leads 64A, 64B etc. connect to an output lead 68 of the overall circuit 50. The output lead 66 connects through a resistor 70 to a voltage supply terminal 72, while the output lead 68 connects through a resistor 74 to the voltage supply terminal 72. The sources of each pair of transistors 54A, 56A, etc. are connected together, and are in turn connected to a respective control line 76A, 76B etc. which connects through a transistor 78A, 78B etc. and resistor 80A, 80B etc. to a ground terminal 82. A voltage supply terminal 84 is connected to the gate of each transistor 78A, 78B etc.

If it is chosen that, for example, the circuit portion 52A be tested, a high voltage signal is applied to the control lines 76B, 76C, 76D through respective diodes 86B, 86C, 86D, each forward biased in the direction from a respective control input line to a respective control line, bringing the sources of the transistors 54B, 56B, 54C, 56C, 54D, 56D high, so that signals applied to those transistors will have no switching effect (the drains of those transistors already being high through being coupled to the voltage supply terminal 72). Thus, with only the control line 76A signal low, full testing of the circuit portion 52A can be undertaken by applying appropriate signals to the input lines 58A, 60A.

If it is then desired that the circuit portion 52B be tested, the signals to control lines 76A, 76C, 76D are taken high, while the signal to control line 52B is held low, and testing of that circuit portion 52B can be undertaken by applying appropriate signals to the gates of transistors 58B, 60B. This testing is undertaken by applying appropriate high and low signals to the gates of the transistors 58B, 60B in accordance with a chosen test program for the particular device involved, as is well known.

The input leads 58A, 60A, 58B, 60B, etc. of each circuit portion include as a part thereof respective disconnectable links in the form of laser programmable fuses 90A, 92A, etc. Likewise, the output leads 62A, 64A, etc. of each circuit portion include as a part thereof respective disconnectable links in the form of laser programmable fuses 94A, 96A, etc. Furthermore, each connection from the reference voltage terminal 84 to the gate of each transistor 78A, 78B, etc. respectively includes a disconnectable link in the form of a laser programmable fuse 98A, 98B, etc.

Once the desired circuit portion is chosen, the other circuit portions can be deleted from the overall circuit 50 by blowing appropriate fuses. In such case, no power is consumed by the deleted circuit portions, and there is no speed penalty suffered by the remaining circuit portion upon such selective disconnection as described above. Blowing of the fuses which are part of the input and output leads reduces loading on the previous and following circuits, while blowing of the fuses connected with all transistors 78A, 78B, etc. avoids use of power as supplied by the voltage terminal 84.

It will readily be seen that each of these circuit portions is testable independently of any of the others, so that power needed to test each such circuit portion can be applied individually thereto.

We claim:

1. A circuit having first and second input leads and an output lead, comprising:
   first switch means having an input lead connected to the first input lead of the circuit, and an output lead connected to the output lead of the circuit;
   second switch means having an input lead connected to the second input lead of the circuit and an output lead connected to the output lead of the circuit;
   a control line connected to the first switch means for determining whether an input signal applied to the first switch means determines an output signal from the first switch means;
   a disconnectable link in the output lead of the first switch means; and
   a disconnectable link in the output lead of the second switch means.

2. The circuit of claim 1 and further comprising a disconnectable link in the input lead of the first switch means, and a disconnectable link in the input lead of the second switch means.

3. A circuit having first and second input leads and an output lead, comprising:
   first switch means having an input lead connected to the first input lead of the circuit, and an output lead connected to the output lead of the circuit;
   second switch means having an input lead connected to the second input lead of the circuit and an output lead connected to the output lead of the circuit;
   a first control line connected to the first switch means;
   a second control line connected to the second switch means;
   a disconnectable link in the output lead of the first switch means;
   a disconnectable link in the output lead of the second switch means;
   a disconnectable link in the input lead of the first switch means; and
   a disconnectable link in the input lead of the second switch means;
   a second output lead;
   wherein the first switch means has a second output lead connected to the second output lead of the circuit, the second output lead of the first switch means including a disconnectable link, and wherein the second switch means has a second output lead connected to the second output lead of the circuit, the second output lead of the second switch means including a disconnectable link;
   wherein said first control line determines whether an input signal applied to said first switch means determines an output signal from the first switch; and
   wherein said second control line determines whether an input signal applied to said second switch means determines an output signal from the second switch means.

4. A circuit having first and second input leads and an output lead, comprising:
   first switch means having an input lead connected to the first input lead of the circuit, and an output lead connected to the output lead of the circuit;
   second switch means having an input lead connected to the second input lead of the circuit and an output lead connected to the output lead of the circuit;
   a first control line connected to the first switch means;
   a second control line connected to the second switch means;
   a disconnectable link in the output lead of the first switch means;
   a disconnectable link in the output lead of the second switch means;
   a disconnectable link in the input lead of the first switch means;
   a disconnectable link in the input lead of the second switch means;
   third and fourth input leads;
   wherein the first switch means has a second input lead connected to the third input lead of the circuit, and the second input lead of the first switch means including a disconnectable link;
   wherein the second switch means has a second input lead connected to the fourth input lead of the circuit, the second input lead of the second switch means including a disconnectable link;
   wherein the first control line determines whether an input signal applied to the first switch means determines an output signal from the first switch means; and
   wherein said second control line determines whether an input signal lead applied to the second switch means determines an output signal from the second switch means.

5. A circuit including first, second, third and fourth input leads, and first and second output leads, a first voltage supply terminal, and a second voltage supply terminal, comprising:
   first switch means having a first input lead connected to the first input lead of the circuit, and a second input lead connected to the second input lead of the circuit;
   second switch means having a first input lead connected to the third input lead of the circuit, and a second input lead connected to the fourth input lead of the circuit;
   the first and second input leads of the first switch means including respective disconnectable links;
   the first and second input leads of the second switch means including respective disconnectable links;
   the first switch means including first and second output leads connected respectively to the first and second output leads of the circuit, the second switch means including first and second output leads connected respectively to the first and second output leads of the circuit;
   the first and second output leads of the first switch means including respective disconnectable links;
   the first and second output leads of the second switch means including respective disconnectable links;
   first and second load means connecting the first and second output leads respectively of the circuit with the first voltage supply terminal;

a first control line connected to the first switch means for determining whether an input signal applied to the first switch means determines an output signal from the first switch means;

third load means connecting the first control line to the second voltage supply terminal;

a first control input line;

fourth load means connecting the first control input line to the first control line;

a second control line connected to the second switch means for determining whether an input signal applied to the first switch means determines an output signal from the first switch means;

fifth load means connecting the second control line to the second voltage supply terminal;

a second control input line;

sixth load means connecting the second control input line to the second control line.

6. The circuit as in claim 5 wherein each of the fourth and sixth load means comprises a diode forward biased in the direction from the respective control input lines to the respective control lines.

7. The circuit as in claim 6 and further comprising a first transistor having a first current handling terminal connected to the first control line, and a second current handling terminal connected to the third load means, and further comprising a second transistor having a first current handling terminal connected to the second control line, and a second current handling terminal connected to the fifth load means.

8. The circuit of claim 7 wherein each of the switch means comprise a pair of transistors, each having a first current handling terminal, a control terminal, and a second current handling terminal, the second current handling terminals of the transistors being connected together and to the control line associated with that switch means, the first current handling terminals connected to respective output leads of that switch means, and the control terminals of the transistors connected to respective input leads of that switch means.

* * * * *